United States Patent
Schwiebert et al.

[11] Patent Number: 6,137,693
[45] Date of Patent: Oct. 24, 2000

[54] HIGH-FREQUENCY ELECTRONIC PACKAGE WITH ARBITRARILY-SHAPED INTERCONNECTS AND INTEGRAL SHIELDING

[75] Inventors: Matthew K. Schwiebert, Santa Rosa; Brian R. Hutchison, Windsor; Geary L. Chew, Foster City; Ron Barnett, Santa Rosa, all of Calif.

[73] Assignee: Agilent Technologies Inc., Palo Alto, Calif.

[21] Appl. No.: 09/127,531

[22] Filed: Jul. 31, 1998

[51] Int. Cl.⁷ .................. H05K 9/00; H05K 1/18
[52] U.S. Cl. .................. 361/803; 361/768; 361/771; 361/779; 361/816; 361/818; 228/180.1; 228/180.21
[58] Field of Search ............... 361/767, 768, 361/818, 779, 803, 816, 771; 257/723; 174/35 R, 35 GC; 228/179.1, 180.1, 180.21, 180.22

[56] References Cited

U.S. PATENT DOCUMENTS

| | | | |
|---|---|---|---|
| 3,429,040 | 2/1969 | Miller | 361/779 |
| 3,591,839 | 7/1971 | Evans | 228/180.22 |
| 4,402,450 | 9/1983 | Abraham et al. | 228/180.22 |
| 4,673,772 | 6/1987 | Satoh et al. | 228/180.22 |
| 4,819,131 | 4/1989 | Watari | 361/803 |
| 4,900,877 | 2/1990 | Dubrow et al. | 174/35 GC |
| 4,922,377 | 5/1990 | Matsumoto et al. | 361/705 |
| 5,024,372 | 6/1991 | Altman et al. | 228/180.22 |
| 5,060,844 | 10/1991 | Behun | 228/180.21 |
| 5,138,436 | 8/1992 | Koepf | 257/728 |
| 5,222,014 | 6/1993 | Lin | 361/792 |
| 5,477,933 | 12/1995 | Nguyen | 361/768 |
| 5,483,421 | 1/1996 | Gedney et al. | 361/771 |
| 5,493,075 | 2/1996 | Chong et al. | 361/767 |
| 5,539,153 | 7/1996 | Schwiebert et al. | 174/260 |
| 5,578,874 | 11/1996 | Kurogi | 257/778 |
| 5,586,715 | 12/1996 | Schwiebert et al. | 228/298.1 |
| 5,591,941 | 1/1997 | Acocella et al. | 361/767 |
| 5,607,099 | 3/1997 | Yeh et al. | 228/180.22 |
| 5,629,241 | 5/1997 | Matloubian | 438/125 |
| 5,643,831 | 7/1997 | Ochiai et al. | 438/616 |
| 5,657,208 | 8/1997 | Noe et al. | 361/803 |
| 5,658,827 | 8/1997 | Aulicino et al. | 228/180.22 |
| 5,672,542 | 9/1997 | Schwiebert et al. | 438/4 |
| 5,699,611 | 12/1997 | Kurogi et al. | 29/840 |
| 5,706,578 | 1/1998 | Hubner | 29/830 |
| 5,783,870 | 7/1998 | Mostafazadeh et al. | 361/803 |
| 5,834,848 | 11/1998 | Iwasaki | 361/767 |
| 5,898,574 | 4/1999 | Tan et al. | 361/767 |
| 5,901,046 | 5/1999 | Ohta et al. | 361/767 |

FOREIGN PATENT DOCUMENTS

| | | |
|---|---|---|
| 2324649 | 10/1998 | United Kingdom . |
| WO90/07792 | 7/1990 | WIPO . |
| WO9109419 | 6/1991 | WIPO . |
| WO9206491 | 4/1992 | WIPO . |

*Primary Examiner*—Jeffrey Gaffin
*Assistant Examiner*—John B. Vigushin

[57] ABSTRACT

A surface mountable high frequency electronic package consisting of substrates stacked on top of each other, with arbitrarily-shaped solder structures such as balls and walls connecting them together; forming a fully-shielded, environmentally-sealed, sandwich in which smaller electronic components and devices are placed. In addition to providing electronic and mechanical interconnection to a mother substrate, the solder structures also provide electromagnetic isolation and shielding, controlled-impedance transmission line structures, and an environmental seal. The entire package is fabricated from conventional materials and components assembled together with automated processes.

13 Claims, 5 Drawing Sheets

HIGH-FREQUENCY ELECTRONIC PACKAGE WITH ARBITRARILY-SHAPED INTERCONNECTS AND INTEGRAL SHIELDING

FIELD OF THE INVENTION

This invention generally relates to electronic packaging technology. More particularly, this invention relates to electronic packaging for high frequency digital, radio frequency (RF), microwave, and millimeter-wave applications.

BACKGROUND

At the scale of an electronic package, electronic signals with frequencies above about one (1) gigahertz (GHz) range tend to behave more like electromagnetic waves as opposed to current flowing through conductors. Such wave behavior includes the tendency to travel through free space and dielectric materials, causing unwanted cross talk between conductors and the emission of electromagnetic interference (EMI). In general, higher operating frequencies result in higher levels of cross talk and radio frequency interference emissions.

For applications with operating frequencies above about one GHz, the geometry of the conductors in an electronic package becomes critical to its function. Conductors must often be shaped into impedance-matched transmission line structures to reduce unwanted signal reflections. Shielding is required around nearly every signal conductor in order to eliminate unwanted cross talk with other signal conductors. Finally, the entire electronic package, including its interconnections to the larger system must be substantially shielded to prevent electromagnetic waves from escaping as unwanted EMI. This is accomplished by wrapping the entire electric package or subsystem in a ground conductor.

For high frequency digital applications, cross talk is controlled through the placement of ground conductors, however this solution is expensive, reduces manufacturability and decreases reliability. Placing as many ground conductors as possible between adjacent signal conductors reduces cross talk. For example, for a ball grid array (BGA) package, this means surrounding each signal ball with several ground balls, surrounding each signal line with ground lines and surrounding each signal plane with ground planes. The result is a complicated package with many balls, lines and planes. This added complexity increases cost of the electronic package while reducing manufacturability and reliability. The same is true for other types of electronic packages used for digital applications such as pin grid array (PGA) packages, solder column carriers, tape automated bonding (TAB) packages, leaded surface mount packages, and chip-scale packages (CSPs).

For high frequency digital applications, EMI emissions are typically mitigated by shrouding the entire electronic assembly or produce in sheet metal shielding. Sheet metal shielding is bulky and expensive.

There are a variety of RF, microwave and millimeter-wave applications that address the problem of cross talk and EMI emissions with hybrid microcircuit packaging (U.S. Pat. Nos. 5,753,972; 5,736,783; 5,692,298; 5,668,408; 5,465,008; 5,448,826; 5,426,405; 5,285,570; 5,235,300). In hybrid microcircuit packaging approach, the bulk of the electronic package is machined out of a solid block of metal. An intricate array of holes, slots, grooves, and channels must be formed to isolate signal-carrying conductors from each other. After the body of a hybrid microcircuits is machined many other machined components, such as connectors, feed-throughs, interconnect pins and lids are attached. The fabrication and assembly of all these pieces is not well suited for automated manufacturing. Hybrid microcircuits are bulky, expensive and difficult to integrate into larger systems such as printed circuit assemblies. Leaded surface mount packages have been used for high-frequency applications as an alternative to hybrid microcircuits (U.S. Pat. Nos. 5,557,144; 5,522,132; 5,401,912; 5,270,673; 5,160,810; 5,122,621; 5,117,068), however, the leads on these packages are unshielded, causing unwanted EMI emissions.

A variant of solder isolation walls has been reported for environmentally sealing flip-chips (U.S. Pat. Nos. 5,578,874; 5,699,611), however this is limited to only individual integrated circuit chips. Finally, a stacked, three dimensional packaging structure was reported (U.S. Pat. No. 5,706,578), however, it uses expensive machined metal parts to interconnect the layers. What is needed is a simple, low-cost electronic packaging approach that provides integral isolation, electromagnetic shielding and environmental protection while utilizing conventional materials and manufacturing processes.

SUMMARY OF THE INVENTION

This invention provides a readily manufacturable high-frequency electronic package with integral electromagnetic isolation, shielding and environmental protection. The electronic package includes multiple stacked substrates, typically multilayer printed circuit boards or ceramic substrates, on top of each other, with arbitrarily shaped solder structures, such as balls and/or walls, connecting them together. Typically, a daughter substrate containing an integrated circuit or electronic subsystem made up of many components will form a surface mountable module, which, when attached to a mother substrate, forms a fully shielded, environmentally sealed electronic package. Furthermore, multiple substrates can be stacked sequentially, resulting in a three dimensional package. The package is manufacturable because it can be fabricated and assembled with automated equipment, and because the solder structures perform many functions, dramatically reducing the number of parts required.

The invention further provides a surface mountable electronic interconnect that provides electrical and mechanical connection to a mother substrate, integral EMI shielding, electromagnetic isolation between signal conductors, and environmental protection. The invention provides arbitrarily shaped interconnects and isolation walls. In the preferred embodiment in which the interconnect material is 37Pb/63Sn solder, the interconnects may be formed with Hewlett-Packard's contained paste deposition technology (see U.S. Pat. Nos. 5,672,542; 5,586,715; 5,539,153). The solder structures are deposited on a predefined solderable surface on a substrate. The substrate bearing solder structures is then alignably placed in communication with a second substrate bearing a corresponding solderable metal pattern. Subsequently, the pair of substrates and solder interconnect are heated, permitting the solder to melt and wet the solderable pattern on the second substrate, thereby simultaneously forming a fixed electrical and mechanical interconnection between the two substrates, an environmental seal, electromagnetic isolation and/or electromagnetic shielding.

The arbitrarily shaped solder structures may create cavities or tunnels or continuous seals or simple interconnect balls. The inventive structures and the devices made thereby are amenable to automated mass production. Other materials are suitable for arbitrarily shaped interconnects, including machined or conductive polymer interposers. Also, the manner in which the substrates are fixably connected may vary, all variations being known to those of average skill in the art and which are intended to be included within the scope of the claims.

DESCRIPTION OF THE PREFERRED EMBODIMENT

Figure 1A:
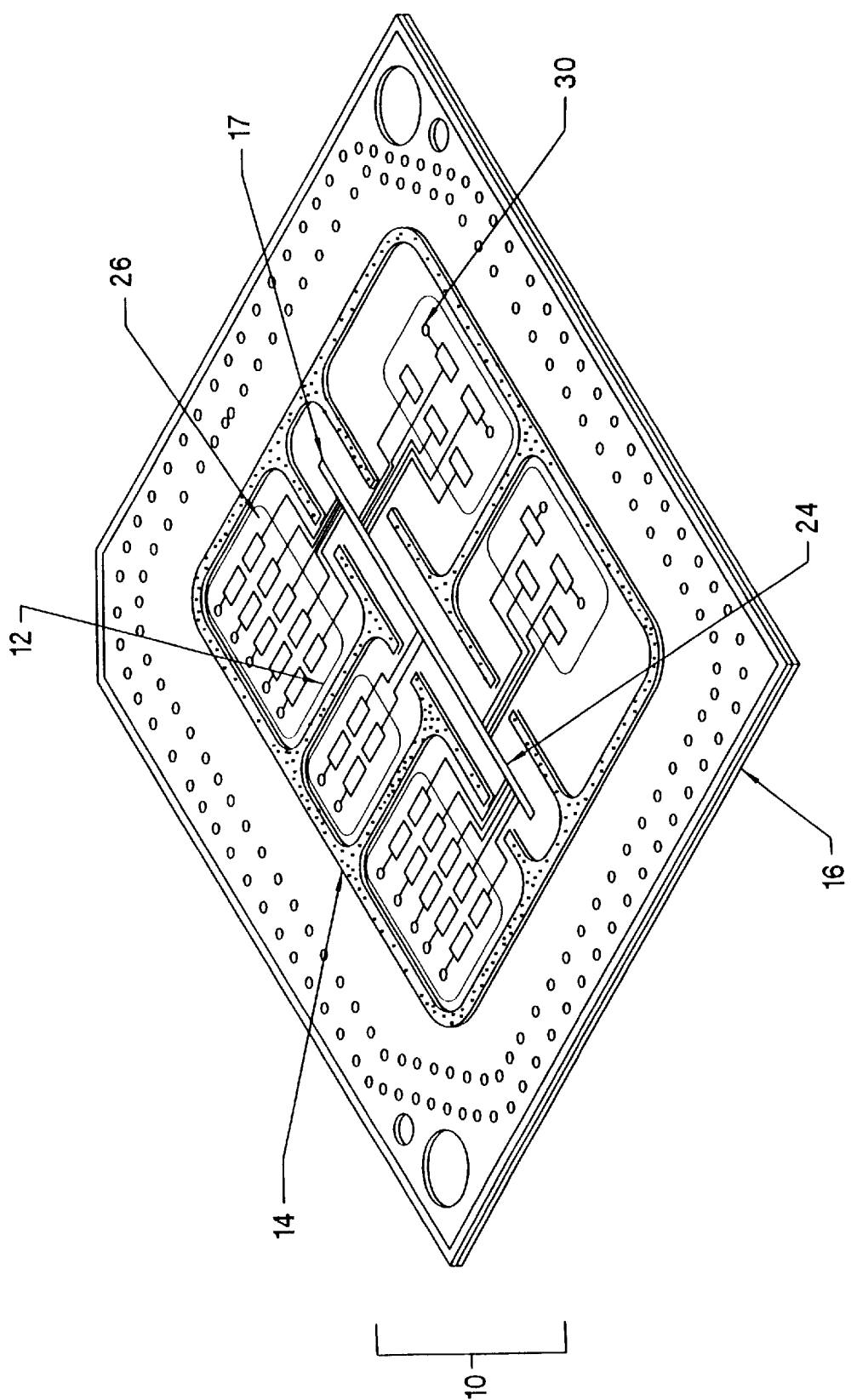
FIG. 1, A and B inclusive, depicts (A) a generalized first daughter substrate, and (B) mother-daughter substrate, according to the invention.

As shown in the drawings for purposes of illustration, the invention provides a low-cost surface mountable electronic package that provides integral isolation, electromagnetic shielding and environmental protection while utilizing conventional materials and manufacturing processes.

Figure 1B:
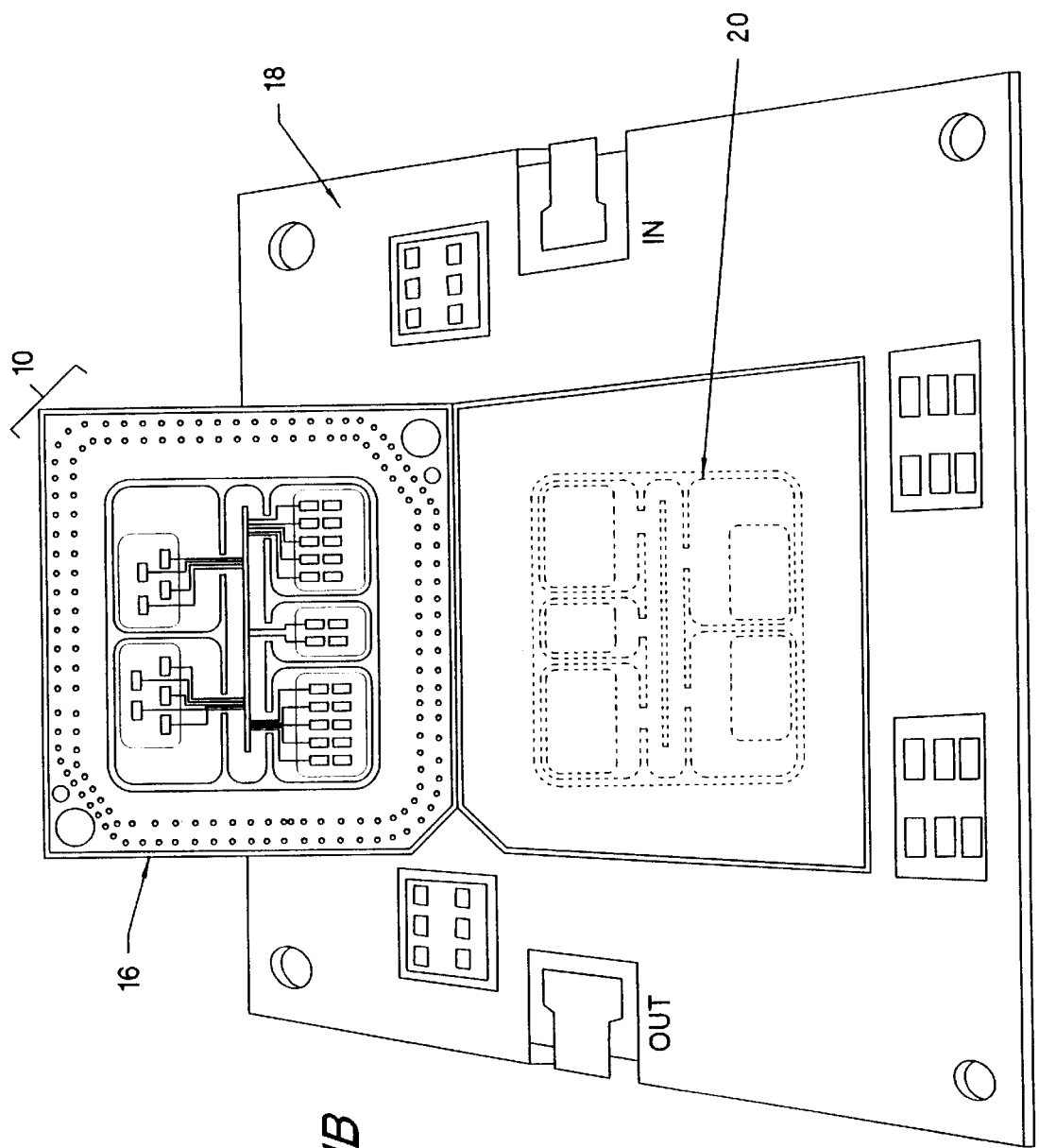

It may be seen by referring to FIGS. 1A and B inclusive, that the invention provides arbitrarily shaped structures 12, 14 on a first surface 13 of a first substrate 16 (also referred to herein for convenience as "daughter substrate"). The shape and position of the arbitrarily shaped structures 12,14 have been predetermined so as to provide isolation, sealing, EMI shielding, or some combination of contributing characteristics. The arbitrarily shaped structures 12, 14 are fixably and operably aligned and in communication with a corresponding pattern of solderable metallization 20 (FIG. 1B) on a facing surface of a second substrate 18 (referred to herein for convenience as the mother substrate). On the daughter substrate 16, various surface mounted components 26 are operably affixed to the first surface 13 in a predetermined relation to the arbitrarily shaped solder features. The operably coupled first and second substrates by means of the arbitrarily shaped structures provide a package with electrical and mechanical interconnection between the two substrates which simultaneously provides electrical isolation, electromagnetic shielding, electrical interconnects and environmental protection. Mechanical stops (not shown) can be used to control the collapse of the interconnect structures while allowing the surface tension of the molten solder interconnects to passively self-align the first substrate to the second substrate.

One application of the preferred embodiment is a surface-mountable, 5 GHz, 130 dB step attenuator module. The daughter substrate is a multilayer printed circuit board on which flip-chips, passive surface mount components and wirebonded devices are placed. Various 63Sn/37Pb solder structures such as balls, walls, and transmission line structures are deposited on a predefined solder-wettable pattern on the surface of the daughter substrate. Along with other components, the daughter substrate is placed face-down, on a larger mother substrate, typically a printed circuit board, with conventional surface mount technology. When assembly methods such as contained paste deposition are used to create the inventive device, the electronic assembly is heated, melting the 63Sn/37Pb solder structures, allowing them to wet a second predefined solder-wettable pattern on the mother substrate circuit board. When the assembly cools, the solder structures solidify and form the electronic package.

The shape of the solder interconnects is carefully designed and controlled so that the solder interconnects can perform a variety of functions. Simple solder balls (like conventional ball grid array interconnects) form low frequency and direct current (DC) electronic interconnects. A gapless solder wall 14 around the periphery of the module, in conjunction with copper ground planes in the substrates, forms an electromagnetic shield around the package, eliminating EMI emissions and stopping external EMI from effecting the module. The gapless peripheral wall also forms a seal against environmental insults such as moisture, humidity and contaminants. Internal walls electromagnetically isolate sections of a module from other sections, eliminating cross talk between the two. Finally, controlled-impedance transmission line structures such as coaxial and horseshoe interconnects (i.e. HP's "Coaxial Solder Interconnect", Docket #: 10971817).

Figure 2:
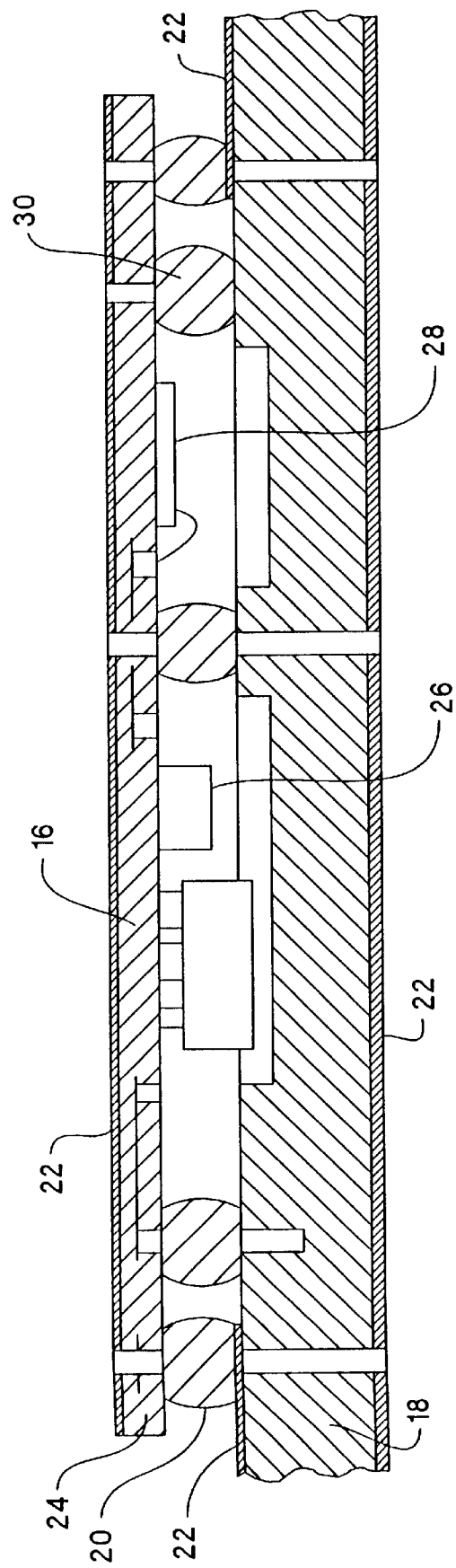
FIG. 2 depicts a generalized surface mount module and mother substrate assembled according to the invention.

FIG. 2 illustrates a cross section of an idealized package according to the invention. A daughter substrate 16 is operably coupled by means of arbitrarily shaped solder interconnects 20, 22 to a mother substrate 18, and a variety of surface mounted components 26, wirebonded devices 28, flipchip devices 24 and conventional solder ball interconnects 30 contribute to the package configuration.

Figure 3:
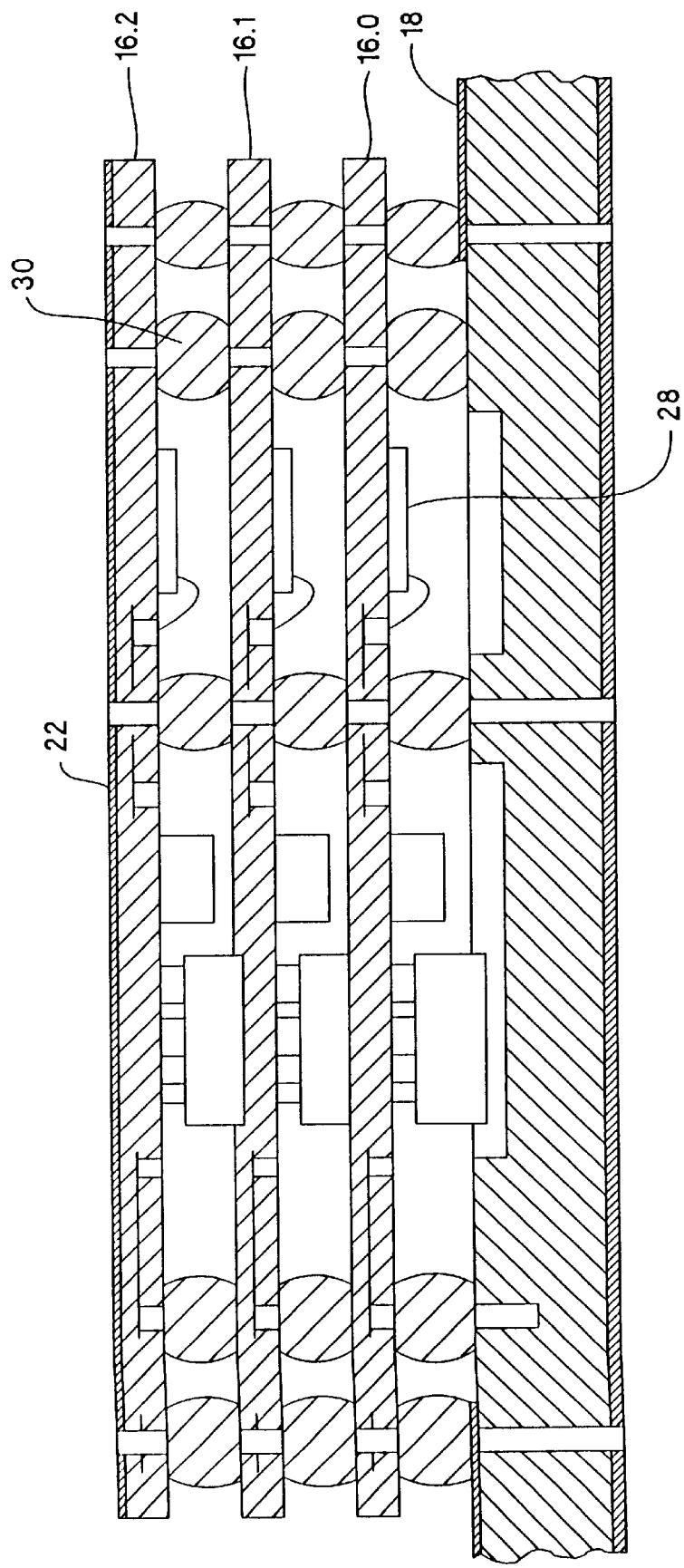
FIG. 3 depicts an alternate embodiment of the invention.

FIG. 3 illustrates the embodiment of the current invention in which a three dimensional package is constructed of a mother substrate 18 and a plurality of daughter substrates 16.0, 16.1, 16.2.

Figure 4:
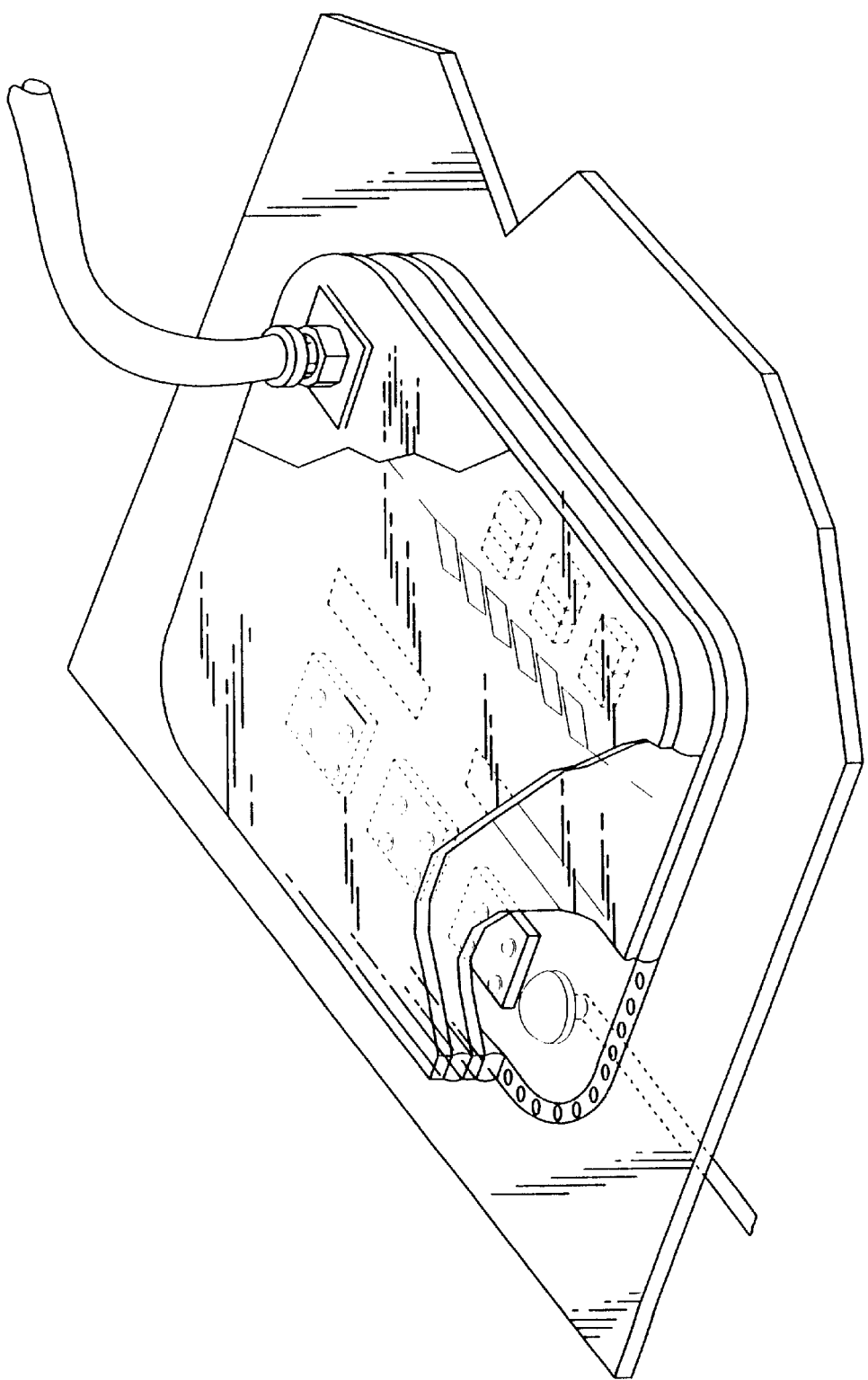
FIG. 4 depicts a partially cutaway perspective view of an embodiment according to FIG. 3.

FIG. 4 is a rendering of a possible application of the three dimensional structure as depicted in cross section in FIG. 3.

As shown in FIGS. 3 and 4, the electronic package consists of substrates stacked on top of each other, with arbitrarily-shaped solder structures such as balls and walls connecting them together, thereby forming a fully-shielded, environmentally-sealed, sandwich in which smaller electronic components and devices are placed. In addition to providing electronic and mechanical interconnection to a mother substrate, the solder interconnect walls also provide electromagnetic isolation between components within the package, electromagnetic shielding around the outside of the package, and an environmental seal. The entire package consists of conventional materials and components assembled together with automated equipment.

Current methods of assembly include such methods a contained paste deposition and similar methods. Arbitrarily-shaped solder structures such as interconnect balls, isolation walls, environmental seals are deposited on the surface of a daughter substrate, typically multilayer printed circuit board or ceramic substrate. The shape of the solder structures is determined by the pattern of exposed solder-wettable metallization on the daughter substrate and the volume of solder deposited. In general, the solder features have a significant height and are coplanar after deposition to facilitate surface mount assembly. Components such as surface mountable passive components, surface mount packages, thin film circuits, flip-chips and wirebonded integrated circuits (ICs) are loaded onto the daughter substrate with automated equipment in between and around the solder structures.

The solder structures or structure according to the invention of a material other than solder, perform several functions. The most elementary structure is a solder ball, which provides an electronic and mechanical interconnection between the substrates, like a conventional ball grid array interconnect. Another simple solder structure is a wall. Internal walls can be used to electromagnetically isolate parts of the module from each other, to reduce or eliminate cross talk between signal carrying conductors. External walls can be used in conjunction with metal planes and edge plating on the substrates to complete a conductive shield around the package to eliminate EMI emissions. External solder walls also protect the internal components of the package from the outside environment by sealing against environmental insults. The solder structures can also be used to form impedance-controlled transmission line structures such as coaxial solder interconnects (HP's "Coaxial Solder Interconnect", Docket #: 10971817). Finally, the solder structures provide all of these functions simultaneously while remaining surface mountable.

Other materials suitable for the arbitrarily shaped structures also include: mechanically or chemically machined metal patterns, conductive epoxy preforms, dispensed conductive epoxies, patterned conductive polymers, metallic fuzz buttons, helical springs or any combination of the above.

The method and the inventive interconnect and devices made thereby are amenable to automated mass production. The means and manner in which the substrates are fixably connected may vary, such variations being know to those of average skill in the art and which are intended to be included within the scope of the claims.

Although the invention has been discussed in terms of the preferred embodiment and a method of forming the inventive interconnect, many variations may occur to one of skill in the art. Thus, the scope of the invention should be determined by the claims set forth; the embodiments set forth herein are preferred and are by way of illustration, but should not in any way be construed to limit the invention.

We claim:

1. A surface mountable electronic package comprising:
    a first substrate, including an arbitrarily shaped solder structure in a predetermined configuration upon said first substrate; and
    a second substrate, including
        a pattern of solder-wettable material corresponding to the predetermined solder configuration on the first substrate, wherein said first and second substrates are alignably and fixably coupled so that the solder configuration of the first substrate is congruent with the wettable pattern on the second substrate so that an operable electronic package is formed and wherein the solder structure includes a gapless wall substantially around the periphery of the package and where both substrates have one or more full ground planes operable along with the gapless wall around the periphery, to substantially shield the package and its interconnects electromagnetically and environmentally.

2. A surface mountable electronic package as in claim 1, wherein the solder structure provides internal walls operable to electromagnetically isolate parts of the package from one another.

3. A surface mountable electronic package as in claim 1, wherein the solder structure includes interconnects that transmit electronic signals between the substrates.

4. A surface mountable electronic package as in claim 1, wherein the solder includes 63Sn/37Pb.

5. A surface mountable electronic package as in claim 4, wherein the solder structure exhibits corner radii sufficient to permit surface tension of molten solder wall to conform to the predetermined arbitrary shape.

6. A surface mountable electronic package as in claim 5, wherein the predetermined arbitrary shape exhibits narrowing, relative to the width of straight sections, around corners such that a substantially uniform, coplanar distribution of solder along the arbitrarily shaped solder structure is encouraged.

7. A surface mountable electronic package as in claim 6 further comprised of solderable metal balls operable as mechanical stops to aid in determining the arbitrarily shaped structure.

8. A surface mountable electronic package comprising:
    a first substrate, including an arbitrarily shaped solder structure in a predetermined configuration upon said first substrate; and
    a second substrate, including
        a pattern of solder-wettable material corresponding to the predetermined solder configuration on the first substrate, wherein said first and second substrates are alignably and fixably coupled so that the solder configuration of the first substrate is congruent with the wettable pattern on the second substrate so that an operable electronic package is formed and wherein the solder structure includes a gapless wall substantially around the periphery of the package, and wherein multiple surface mountable packages are operably connected to the second substrate which is larger than the first substrate; and,
    wherein multiple substrates are operably connected on top of each other forming a vertical stack resulting in a three-dimensional package.

9. An electronic package comprising:
    a first substrate, on which a pattern of solder walls is deposited; and
    a second substrate, including
        a pattern of solder-wettable material corresponding to the pattern of solder walls on the first substrate, wherein said first and second substrates are alignably and fixably coupled so that the pattern of solder walls of the first substrate is congruent with the wettable pattern on the second substrate so that an operable electronic package is formed;
    wherein the pattern of solder walls includes a gapless wall substantially around the periphery of the package; and,
    where the first substrate has electronic components including integrated circuit chips and passive components mounted on it to form an electronic subsystem.

10. An electronic package comprising:
    a first substrate, on which a pattern of solder walls is deposited; and
    a second substrate, including
        a pattern of solder-wettable material corresponding to the pattern of solder walls on the first substrate, wherein said first and second substrates are alignably and fixably coupled so that the pattern of solder walls of the first substrate is congruent with the wettable pattern on the second substrate so that an operable electronic package is formed;
    wherein the pattern of solder walls includes a gapless wall substantially around the periphery of the package; and,
    where both substrates have one or more full ground planes operable along with the gapless wall around the periphery, to substantially shield the package and its interconnects electromagnetically and environmentally.

11. An electronic package as in claim 10, where the pattern of solder walls forms cavities, tunnels, or continuous seals that provide electromagnetic isolation between the electronic components and/or electronic interconnects.

12. An electronic package comprising:

a first substrate, on which a pattern of solder walls is deposited; and a second substrate, including a pattern of solder-wettable material corresponding to the pattern of solder walls on the first substrate, wherein said first and second substrates are alignably and fixably coupled so that the pattern of solder walls of the first substrate is congruent with the wettable pattern on the second substrate so that an operable electronic package is formed;

wherein the pattern of solder walls includes a gapless wall substantially around the periphery of the package; and, where the first substrate is a multi-layer printed circuit board or a ceramic substrate.

13. An electronic package comprising:

a first substrate, on which a pattern of solder walls is deposited; and a second substrate, including a pattern of solder-wettable material corresponding to the pattern of solder walls on the first substrate, wherein said first and second substrates are alignably and fixably coupled so that the pattern of solder walls of the first substrate is congruent with the wettable pattern on the second substrate so that an operable electronic package is formed;

wherein the pattern of solder walls includes a gapless wall substantially around the periphery of the package; and, where the edges of the first substrate are plated with electrically conductive metallization, which, with the gapless wall and continuous ground planes in the substrates, complete the electromagnetic shielding and environmental isolation.

* * * * *